(12) United States Patent
Arai et al.

(10) Patent No.: US 6,774,438 B2
(45) Date of Patent: Aug. 10, 2004

(54) SEMICONDUCTOR INTEGRATED CIRCUIT DEVICE INCLUDING AN ESD PROTECTION CIRCUIT WITH AN IMPROVED ESD PROTECTION CAPABILITY FOR INPUT OR OUTPUT CIRCUIT PROTECTION

(75) Inventors: Katsuya Arai, Kyoto (JP); Toshihiro Kohgami, Kyoto (JP); Shiro Usami, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 177 days.

(21) Appl. No.: 10/252,709

(22) Filed: Sep. 24, 2002

(65) Prior Publication Data

US 2003/0071311 A1 Apr. 17, 2003

(30) Foreign Application Priority Data

Oct. 12, 2001 (JP) ........................................ 2001-314894

(51) Int. Cl.[7] ............................................... H01L 23/62
(52) U.S. Cl. ...................... 257/358; 257/357; 257/360; 257/361; 257/362; 257/363
(58) Field of Search ................................. 257/356, 357, 257/358, 360, 361, 362, 363

(56) References Cited

U.S. PATENT DOCUMENTS

| | | | |
|---|---|---|---|
| 5,610,425 A | * | 3/1997 | Quigley et al. .............. 257/358 |
| 5,744,842 A | * | 4/1998 | Ker ............................. 257/362 |
| 6,369,427 B1 | * | 4/2002 | Williamson .................. 257/355 |
| 6,437,407 B1 | * | 8/2002 | Ker et al. .................... 257/357 |
| 6,611,025 B2 | * | 8/2003 | Lin ............................. 257/355 |

* cited by examiner

*Primary Examiner*—Ngan V. Ngo
(74) *Attorney, Agent, or Firm*—McDermott Will & Emery LLP

(57) ABSTRACT

A semiconductor integrated circuit device includes an external connection pad, an electrostatic discharge protection circuit, an output circuit, an output pre-buffer circuit, an output-signal-fixing circuit and an internal circuit. The output-signal-fixing circuit includes a first capacitor and a second capacitor and fixes an output signal from a second pre-buffer circuit at an "L" level (low voltage) even when an output from the internal circuit is in a floating state. During an ESD test, since an output signal from the second pre-buffer circuit is fixed at an "L" level (low voltage) by the output-signal-fixing circuit, the NMIS transistor is in an OFF state. In this manner, a surge current is prevented from flowing locally into the NMIS transistor.

5 Claims, 4 Drawing Sheets

SEMICONDUCTOR INTEGRATED CIRCUIT DEVICE INCLUDING AN ESD PROTECTION CIRCUIT WITH AN IMPROVED ESD PROTECTION CAPABILITY FOR INPUT OR OUTPUT CIRCUIT PROTECTION

BACKGROUND OF THE INVENTION

The present invention relates to semiconductor integrated circuit devices including an electrostatic discharge (ESD) protection circuit and more particularly relates to a semiconductor integrated circuit device including an ESD protection circuit with an improved ESD protection capability for input or output circuit protection.

In recent years, the degree of integration of semiconductor integrated circuit devices has been increasing along with the technical advancements in the fabrication process, i.e., a reduction in size and an increase in density. Along with this, such devices have become more vulnerable to damages caused by electrostatic discharge (hereinafter referred to as "surge"). For example, there are high possibilities that a surge entering through an external connection pad damages an element such as an input circuit, an output circuit, an input and output circuit or an internal circuit, or causes the characteristics of such an element to deteriorate. For this reason, the external connection pad is often provided with a protection circuit for protecting the input circuit, the output circuit, the input and output circuit or the internal circuit from a surge.

FIG. 3 is an electric circuit diagram illustrating the configuration of an output circuit and other elements around the output circuit in a known semiconductor integrated circuit device including an electrostatic discharge protection circuit. As shown in FIG. 3, the semiconductor integrated circuit device includes an external connection pad 101, an electrostatic discharge protection circuit 102, an output circuit 103, an output pre-buffer circuit 104, and an internal circuit 121, and is configured so that the output circuit 103 is protected by the electrostatic discharge protection circuit 102 from a surge entering through the external connection pad 101.

The electrostatic discharge protection circuit 102 is provided between the external connection pad 101 and the output circuit 103, and includes a PMIS transistor 105, an NMIS transistor 106, a first resistor 107, and a second resistor 108. The PMIS transistor 105 includes: a source connected to a power supply line 119 for supplying a power supply voltage VDD; a gate connected to the power supply line 119 via the first resistor 107; a drain connected to the external connection pad 101; and a substrate region (n well) connected to the power supply line 119. The NMIS transistor 106 includes: a source connected to a ground line 120 for supplying a ground voltage VSS; a gate connected to the ground line 120 via the second resistor 108; a drain connected to the external connection pad 101; and a substrate region (p well) connected to the ground line 120.

The output circuit 103 is provided between the electrostatic discharge protection circuit 102 and the output pre-buffer circuit 104, and includes a PMIS transistor 111 and an NMIS transistor 112. The PMIS transistor 111 includes: a source connected to the power supply line 119; a gate connected to an output part of a first pre-buffer 115 in the output pre-buffer circuit 104; a drain connected to the external connection pad 101; and a substrate region (n well) connected to the power supply line 119. The NMIS transistor 112 includes: a source connected to the ground line 120; a gate connected to an output part of a second pre-buffer 117 in the output pre-buffer circuit 104; a drain connected to the external connection pad 101; and a substrate region (p well) connected to the ground line 120.

The output pre-buffer circuit 104 for amplifying an output signal from the internal circuit 121 is provided between the internal circuit 121 and the output circuit 103, and includes a first pre-buffer circuit 116 and a second pre-buffer circuit 118. The first pre-buffer circuit 116 includes the first pre-buffer 115 in the final stage and the second pre-buffer circuit 118 includes the second pre-buffer 117 in the final stage. The first pre-buffer circuit 116 and the second pre-buffer circuit 118 each include a plurality of pre-buffers according to the degree of amplification by which an output signal from the internal circuit 121 is to be amplified. In the first pre-buffer circuit 116, each of the pre-buffers includes a voltage supply part connected to the power supply line 119 and a ground part connected to the ground line 120, the output part of the final-stage pre-buffer is connected to the gate of the PMIS transistor 111 in the output circuit 103, and an input part of the pre-buffer in the initial stage is connected to the internal circuit 121. In the second pre-buffer circuit 118, each of the pre-buffers includes a voltage supply part connected to the power supply line 119 and a ground part connected to the ground line 120, the output part of the final-stage pre-buffer is connected to the gate of the NMIS transistor 112 in the output circuit 103, and an input part of the pre-buffer in the initial stage is connected to the internal circuit 121. The first and second pre-buffer circuits 116 and 118 are configured so that two high and low output signals or two identical output signals are output from the output part of the final-stage first pre-buffer 115 in the first pre-buffer circuit 116 and from the output part of the final-stage second pre-buffer 117 in the second pre-buffer circuit 118.

With the conventional semiconductor integrated circuit device having such a configuration, a surge applied between the power supply line 119 and the external connection pad 101 is absorbed by breakdown of the PMIS transistor 105, and a surge applied between the ground line 120 and the external connection pad 101 is absorbed by breakdown of the NMIS transistor 106. Thus, it is possible to effectively protect the output circuit 103 from a surge entering from the outside through the external connection pad 101.

Incidentally, semiconductor integrated circuit devices need to meet an ESD test standard because it is required to assure the users of a certain surge breakdown withstand voltage. In recent years, a human body model (HBM) ESD test standard such as an MIL standard has become the global standard as an ESD test standard, and semiconductor integrated circuit devices need to meet the HBM test standard.

FIG. 4A is a circuit diagram illustrating an evaluation circuit for conducting an ESD test based on the HBM test standard, and FIG. 4B is a waveform diagram illustrating HBM discharge waveform specifications of the MIL standard.

As illustrated in FIG. 4A, the evaluation circuit includes a charging power supply 150 and a discharging resistor 153 having a resistance of R=1.5 kΩ, which are arranged respectively in two circuits (the left-side circuit and the right-side circuit illustrated in FIG. 4A). The two circuits are arranged in parallel with respect to a charging/discharging capacitor 151 having a capacitance of C=100 pF. A selector switch 152 is connected to one electrode of the charging/discharging capacitor 151, and the selector switch 152 is used to selectively connect said one electrode of the charging/discharging capacitor 151 either to a high-voltage portion of the variable-voltage charging power supply 150 or to the discharging resistor 153. Moreover, the other electrode of the charging/discharging capacitor 151 is connected to a low-voltage portion of the charging power supply 150 in the left-side circuit illustrated in FIG. 4A and is connected to the discharging resistor 153 in the right-side circuit illustrated in FIG. 4A. A subject device 154 is placed in the right-side circuit illustrated in FIG. 4A between the other electrode of the charging/discharging capacitor 151 and the discharging resistor 153 so that an ESD test is conducted on the subject device 154.

In order to conduct an ESD test using the evaluation circuit, said one electrode of the charging/discharging capacitor 151 is first connected to the charging power supply 150 by using the selector switch 152. Then, the left-side circuit illustrated in FIG. 4A becomes a closed circuit, and the charging/discharging capacitor 151 is charged by the charging power supply 150 so that the charged voltage thereof is 4000 V, for example. Next, said one electrode of the charging/discharging capacitor 151 is switched to the discharging resistor 153 by using the selector switch 152. Then, the right-side circuit illustrated in FIG. 4A becomes a closed circuit, and the charge stored in the charging/discharging capacitor 151 is applied to the subject device 154, which is a semiconductor integrated circuit device, via the discharging resistor 153.

At this point in time, the test is conducted based on the HBM discharge waveform specifications as illustrated in FIG. 4B. In FIG. 4B, the horizontal axis represents the stress application time, the vertical axis represents the surge current (A), Tr denotes the rise time (ns), and Td denotes the attenuation time (ns).

In the conventional semiconductor integrated circuit device illustrated in FIG. 3, the power supply voltage VDD and the ground voltage VSS are connected to the power supply line 119 and the ground line 120, respectively, during normal use. On the other hand, when the ESD test is conducted based on the HBM test standard, the power supply line 119 is in an open state with its potential being unfixed and the ground line 120 is fixed to the ground voltage VSS. Thus, in the right-side circuit in the evaluation circuit illustrated in FIG. 4A, the voltage between the two electrodes of the charging/discharging capacitor 151 is applied to the discharging resistor 153 and the semiconductor integrated circuit device (subject device 154), and at this time, a voltage that has been lowered by the discharging resistor 153 is applied to the external connection pads for the input circuit and the output circuit (the input circuit and the external connection pad for the input circuit are not shown). Note that a positive or negative charge is applied to the external connection pad 101 for the output circuit illustrated in FIG. 3, and it is determined whether the ESD standard is satisfied.

However, when the conventional semiconductor integrated circuit device illustrated in FIG. 3 is subjected to an ESD test based on the HBM test standard (VSS ground), the NMIS transistor 112 in the output circuit 103 may be locally damaged or the withstand voltage thereof may be decreased.

It is believed that the damage to the NMIS transistor 112 or the decrease in the withstand voltage thereof occurs due to the following reason.

When a positive charge is applied to the external connection pad 101 with the power supply line 119 being in an open state and the ground line 120 being fixed to the ground voltage VSS, the p-n junction between the drain region and the substrate region of the PMIS transistor 105 becomes a parasitic forward diode 109, and the p-n junction between the drain region and the substrate region of the PMIS transistor 111 becomes a parasitic forward diode 113, in the circuit extending from the external connection pad 101 to the power supply line 119. On the other hand, in the circuit extending from the external connection pad 101 to the ground line 120, the p-n junction between the drain region and the substrate region of the NMIS transistor 106 becomes a parasitic reverse diode 110, and the p-n junction between the drain region and the substrate region of the NMIS transistor 112 becomes a parasitic reverse diode 114.

Therefore, the positive charge that has been applied to the external connection pad 101 flows into the power supply line 119 through the parasitic forward diodes 109 and 113 to increase the potential of the power supply line 119, thereby increasing the potential of the voltage supply part of the second pre-buffer 117. At this time, the NMIS transistor 106 in the electrostatic discharge protection circuit 102 is in an OFF state with its gate potential fixed at the ground potential, and an output from the internal circuit 121 is in a floating state, which may increase the potential of an input part of the second pre-buffer 117. This increased potential may cause the second pre-buffer 117 to output a signal at an "H" level (high voltage). In that case, the NMIS transistor 112 in the output circuit 103 is turned ON.

When the NMIS transistor 112 is turned ON before the NMIS transistor 106 is turned ON in such a manner as described above, an electrostatic discharge current (surge current) flows locally through the NMIS transistor 112. It is believed that this is the cause of the local damage to the NMIS transistor 112 and the decrease in the withstand voltage thereof.

SUMMARY OF THE INVENTION

It is therefore an object of the present invention to provide a semiconductor integrated circuit device including an electrostatic discharge protection circuit with an ESD protection capability that satisfies the requirements in a surge test based on the HBM test standard.

In a principal aspect of the present invention, a semiconductor integrated circuit device includes: an external connection pad; an electrostatic discharge protection circuit connected to the external connection pad; an output circuit connected to the external connection pad; an output pre-buffer circuit connected to the output circuit; an output-signal-fixing circuit connected to the output pre-buffer circuit, the output-signal-fixing circuit being for fixing an output signal from the output pre-buffer circuit at an "L" level; and a power supply line and a ground line, the power supply line being for supplying a power supply voltage to the electrostatic discharge protection circuit, the output circuit and the output pre-buffer circuit.

With this structure, even when the potential of the power supply line is increased by application of a positive charge to the external connection pad during an EST test, the output-signal-fixing circuit connected to the output pre-buffer circuit causes the output pre-buffer circuit to output a signal not at an "H" level (high voltage) but at an "L" level (low voltage). Therefore, when the positive charge is applied to the external connection pad in the ESD test, the output circuit's NMIS transistor is in an OFF state, which allows the applied positive charge to flow into the ground line through an NMIS transistor in the electrostatic discharge protection circuit. In this manner, it is possible to suppress a current from flowing locally into an element in the output circuit and causing surge damage to the element. Thus, a semiconductor integrated circuit device with a high surge withstand voltage can be obtained.

In another aspect of the invention, the output-signal-fixing circuit includes first and second capacitors each including two electrodes. One of the electrodes of the first capacitor is connected to an output part of a pre-buffer in the pre-buffer circuit and the other electrode of the first capacitor is connected to the ground line. And one of the electrodes of the second capacitor is connected to an input part of the pre-buffer and the other electrode of the second capacitor is connected to the power supply line. Then, an output signal from the pre-buffer circuit can be fixed at an "L" level (low voltage).

In a further aspect of the present invention, the electrostatic discharge protection circuit includes a first PMIS transistor and a first NMIS transistor. The first PMIS transistor includes a source connected to the power supply line, a drain connected to the external connection pad, and an n-type substrate region connected to the power supply line. And the first NMIS transistor includes a source connected to the ground line, a drain connected to the external connection pad, and a p-type substrate region connected to the ground line. The output pre-buffer circuit includes a first pre-buffer circuit and a second pre-buffer circuit. The first pre-buffer circuit includes, in a final stage, a first pre-buffer whose voltage supply part is connected to the power supply line, and the second pre-buffer circuit includes a second pre-buffer whose voltage supply part is connected to the power supply line. The output circuit includes a second PMIS transistor and a second NMIS transistor. The second PMIS transistor includes a source connected to the power supply line, a drain connected to the external connection pad, a gate connected to an output part of the first pre-buffer, and an n-type substrate region connected to the power supply line, and the second NMIS transistor includes a source connected to the ground line, a drain connected to the external connection pad, a gate connected to an output part of the second pre-buffer, and a p-type substrate region connected to the ground line. And the output-signal-fixing circuit includes first and second capacitors. One electrode of the first capacitor is connected to the output part of the second pre-buffer in the output pre-buffer circuit. The other electrode of the first capacitor is connected to the ground line. One electrode of the second capacitor is connected to an input part of the second pre-buffer in the output pre-buffer circuit, and the other electrode of the second capacitor is connected to the power supply line. Then, during an ESD test, an output from the second pre-buffer circuit can be fixed at an "L" level (low voltage), and the second NMIS transistor can be in an OFF state. In this manner, it is possible to prevent a surge current from flowing locally into the second NMIS transistor and causing the surge withstand voltage thereof to decrease.

In yet another aspect of the present invention, the output-signal-fixing circuit includes a NOR pre-buffer, a third capacitor and a resistor. The third capacitor includes two electrodes. The NOR pre-buffer includes an output part connected to the output circuit, a first input part connected to an output part of a pre-buffer in the pre-buffer circuit, and a second input part connected to one of the electrodes of the third capacitor and one end of the resistor. Said one electrode of the third capacitor is connected to the second input part of the NOR pre-buffer while the other electrode of the third capacitor is connected to the power supply line. And said one end of the resistor is connected to the second input part of the NOR pre-buffer while the other end of the resistor is connected to the ground line. Then, an output signal from the pre-buffer circuit can be fixed at an "L" level (low voltage).

In still another aspect of the present invention, the electrostatic discharge protection circuit includes a first PMIS transistor and a first NMIS transistor. The first PMIS transistor includes a source connected to the power supply line, a drain connected to the external connection pad, and an n-type substrate region connected to the power supply line, and the first NMIS transistor includes a source connected to the ground line, a drain connected to the external connection pad, and a p-type substrate region connected to the ground line. The output pre-buffer circuit includes a first pre-buffer circuit and a second pre-buffer circuit. The first pre-buffer circuit includes, in a final stage, a first pre-buffer whose power supply part is connected to the power supply line, and the second pre-buffer circuit includes, in a final stage, a second pre-buffer whose power supply part is connected to the power supply line. The output circuit includes a second PMIS transistor and a second NMIS transistor. The second PMIS transistor includes a source connected to the power supply line, a drain connected to the external connection pad, a gate connected to an output part of the first pre-buffer, and an n-type substrate region connected to the power supply line, and the second NMIS transistor includes a source connected to the ground line, a drain connected to the external connection pad, a gate connected to an output part of the second pre-buffer, and a p-type substrate region connected to the ground line. The output-signal-fixing circuit includes a NOR pre-buffer, a third capacitor and a resistor. The third capacitor includes two electrodes. The NOR pre-buffer is provided between the second NMIS transistor and the second pre-buffer, and includes an output part connected to the gate of the second NMIS transistor, a first input part connected to the output part of the second pre-buffer, and a second input part connected to one of the electrodes of the third capacitor and one end of the resistor. Said one electrode of the third capacitor is connected to the second input part of the NOR pre-buffer while the other electrode of the third capacitor is connected to the power supply line. And said one end of the resistor is connected to the second input part of the NOR pre-buffer while the other end of the resistor is connected to the ground line. Then, during an ESD test, an output from the second pre-buffer circuit can be fixed at an "L" level (low voltage), and the second NMIS transistor can be in an OFF state. In this manner, it is possible to prevent a surge current from flowing locally into the second NMIS transistor and causing the surge withstand voltage thereof to decrease.

DESCRIPTION OF THE PREFERRED EMBODIMENTS (First Embodiment)

Figure 1:
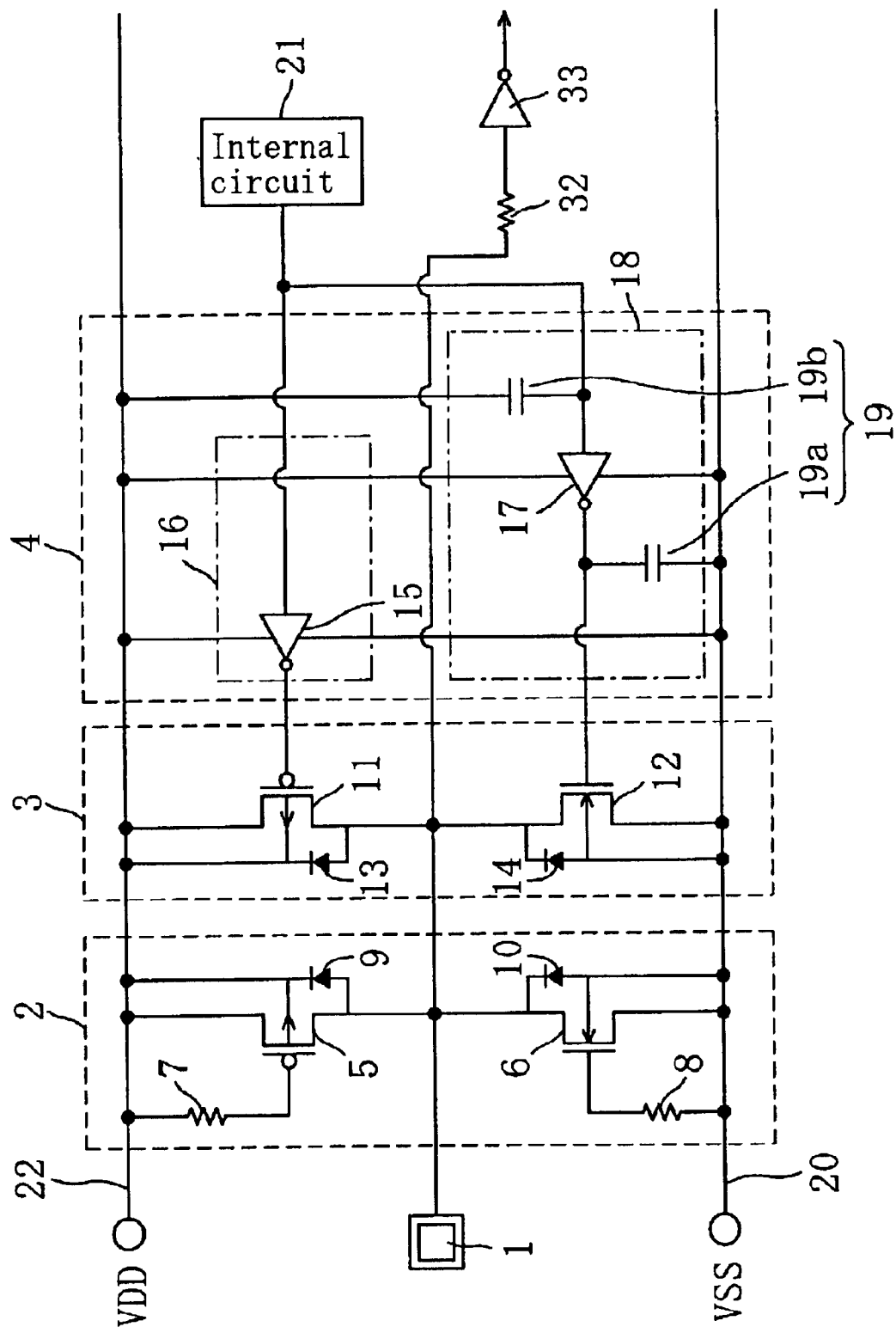
FIG. 1 is an electric circuit diagram illustrating the configuration of an output circuit and other elements around the output circuit in a semiconductor integrated circuit device according to a first embodiment of the present invention.

FIG. 1 is an electric circuit diagram illustrating the configuration of an output circuit and other elements around the output circuit in a semiconductor integrated circuit device including an electrostatic discharge protection circuit according to a first embodiment of the present invention. As illustrated in FIG. 1, the semiconductor integrated circuit device includes an external connection pad 1, an electrostatic discharge protection circuit 2, an output circuit 3, an output pre-buffer circuit 4, an internal circuit 21 and an output-signal-fixing circuit 19, and is configured so that the output circuit 3 is protected by the electrostatic discharge protection circuit 2 from a surge entering through the external connection pad 1. A feature of the present embodiment is the provision of the output-signal-fixing circuit 19, which controls an output signal from the output pre-buffer circuit 4 during an ESD test.

The electrostatic discharge protection circuit 2 is provided between the external connection pad 1 and the output circuit 3, and includes a PMIS transistor 5, an NMIS transistor 6, a first resistor 7 and a second resistor 8. The PMIS transistor 5 includes: a source connected to a power supply line 22 for supplying a power supply voltage VDD; a gate connected to the power supply line 22 via the first resistor 7; a drain connected to the external connection pad 1; and a substrate region (n well) connected to the power supply line 22. The NMIS transistor 6 includes: a source connected to a ground line 20 for supplying a ground voltage VSS; a gate connected to the ground line 20 via the second resistor 8; a drain connected to the external connection pad 1; and a substrate region (p well) connected to the ground line 20.

The output circuit 3 is provided between the electrostatic discharge protection circuit 2 and the output pre-buffer circuit 4, and includes a PMIS transistor 11 as an H-side output circuit and an NMIS transistor 12 as an L-side output circuit. The PMIS transistor 11 includes: a source connected to the power supply line 22; a gate connected to an output part of a first pre-buffer 15 in the output pre-buffer circuit 4; a drain connected to the external connection pad 1; and a substrate region (n well) connected to the power supply line 22. The NMIS transistor 12 includes: a source connected to the ground line 20; a gate connected to an output part of a second pre-buffer 17 in the output pre-buffer circuit 4; a drain connected to the external connection pad 1; and a substrate region (p well) connected to the ground line 20.

The output pre-buffer circuit 4 for amplifying an output signal from the internal circuit 21 is provided between the internal circuit 21 and the output circuit 3, and includes a first pre-buffer circuit 16 and a second pre-buffer circuit 18. The first pre-buffer circuit 16 includes the first pre-buffer 15 in the final stage and the second pre-buffer circuit 18 includes the second pre-buffer 17 in the final stage. The first pre-buffer circuit 16 and the second pre-buffer circuit 18 each include a plurality of pre-buffers according to the degree of amplification by which an output signal from the internal circuit 21 is to be amplified.

In the first pre-buffer circuit 16, each of the pre-buffers includes a voltage supply part connected to the power supply line 22 and a ground part connected to the ground line 20, the output part of the pre-buffer 15 in the final stage is connected to the gate of the PMIS transistor 11 in the output circuit 3, and an input part of the pre-buffer in the initial stage is connected to the internal circuit 21. In the second pre-buffer circuit 18, each of the pre-buffers includes a voltage supply part connected to the power supply line 22 and a ground part connected to the ground line 20, the output part of the pre-buffer 17 in the final stage is connected to the gate of the NMIS transistor 12 and an input part of the pre-buffer in the initial stage is connected to the internal circuit 21. The first and second pre-buffer circuits 16 and 18 are configured so that two high and low output signals or two identical output signals are output from the output part of the first pre-buffer 15 and from the output part of the second pre-buffer 17.

The output-signal-fixing circuit 19 is used to fix, at an "L" level (low voltage), an output signal from the second pre-buffer circuit 18 connected to the gate of the NMIS transistor 12 that serves as an L-side output circuit during an ESD test, and the output-signal-fixing circuit 19 includes a first capacitor 19a and a second capacitor 19b. One electrode of the first capacitor 19a is connected to the output part of the second pre-buffer 17 and the other electrode thereof is connected to the ground line 20. One electrode of the second capacitor 19b is connected to an input part of the second pre-buffer 17 and the other electrode thereof is connected to the power supply line 22. Note that since the output-signal-fixing circuit 19 needs only be able to fix an output signal from the second pre-buffer circuit 18 at an "L" level (low voltage) during an ESD test, the number and locations of capacitors in the second pre-buffer circuit 18 are not limited to those mentioned in the foregoing description.

Figure 4A:
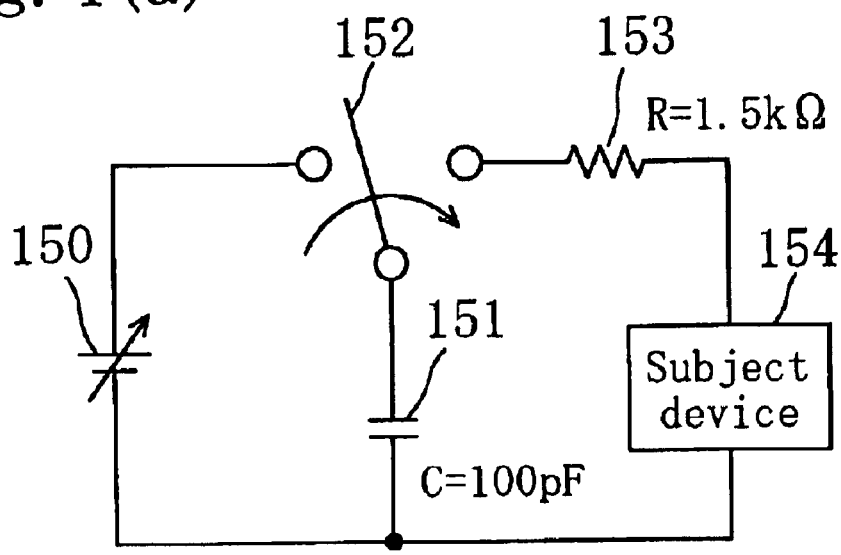
FIG. 4A is a circuit diagram illustrating an evaluation circuit for conducting an ESD test based on the HBM test standard.
Figure 4B:
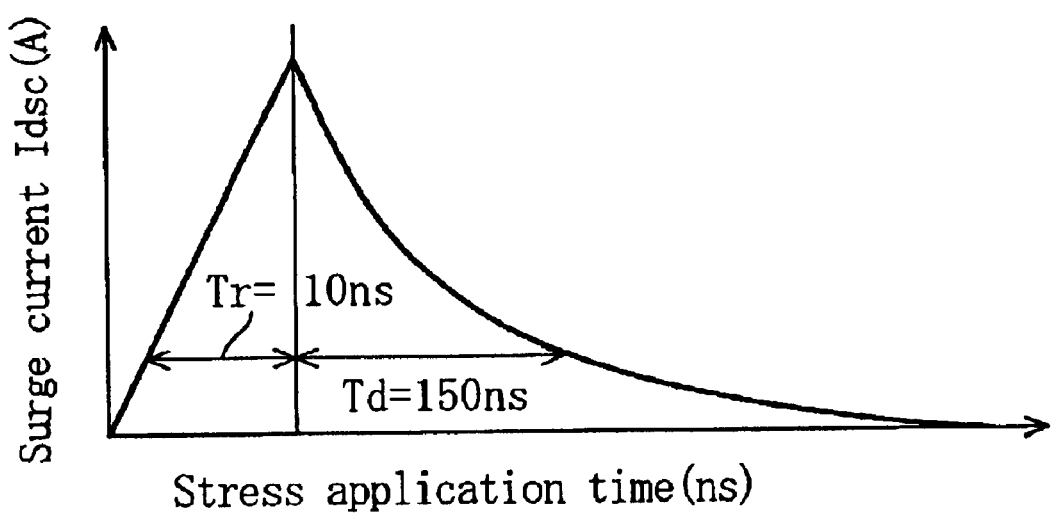
FIG. 4B is a waveform diagram illustrating HBM discharge waveform specifications of the MIL standard.

With the semiconductor integrated circuit device of the first embodiment, even when an output from the internal circuit 21 is in a floating state, the output-signal-fixing circuit 19 fixes an output signal from the second pre-buffer circuit 18 at an "L" level (low voltage). Therefore, the gate voltage of the NMIS transistor 12 serving as an L-side output circuit in the output circuit 3 is fixed at an "L" level (low voltage), and the NMIS transistor 12 is thus in an OFF state. Accordingly, in the case of an ESD test conducted by using an evaluation circuit as illustrated in FIG. 4A based on the HBM discharge waveform specifications as illustrated in FIG. 4B, even when the potential of the power supply line 22, to which the voltage supply part of the second pre-buffer 17 is connected, is increased, the gate voltage of the NMIS transistor 12 in the output circuit 3 can be fixed at an "L" level (low voltage) by the output-signal-fixing circuit 19. In this manner, it is possible to prevent damage to the NMIS transistor 12 or decrease in the surge withstand voltage thereof caused by surge current flowing locally into the NMIS transistor 12.

This effect will now be described in greater detail. When a positive charge is applied to the external connection pad 1 in the semiconductor integrated circuit device illustrated in FIG. 1 during an ESD test, the p-n junction between the drain region and the substrate region (n well) of the PMIS transistor 5 becomes a parasitic forward diode 9, and the p-n junction between the drain region and the substrate region (n well) of the PMIS transistor 11 becomes a parasitic forward diode 13, in the circuit extending from the external connection pad 1 to the power supply line 22. On the other hand, in the circuit extending from the external connection pad 1 to the ground line 20, the p-n junction between the drain region and the substrate region (p well) of the NMIS transistor 6 becomes a parasitic reverse diode 10, and the p-n junction between the drain region and the substrate region (p well) of the NMIS transistor 12 becomes a parasitic reverse diode 14.

The positive charge that has been applied to the external connection pad 1 therefore flows into the power supply line 22 through the parasitic forward diodes 9 and 13 to increase the potential of the power supply line 22.

This brings the output pre-buffer circuit 4 into a state as though the power were on, and at this point in time, an output from the internal circuit 21 is in a floating state. However, an output signal from the second pre-buffer circuit 18 is fixed at an "L" level (low voltage) by the output-signal-fixing circuit 19, and the NMIS transistor 12 in the output circuit 3 is thus turned OFF. Therefore, it is possible to prevent the NMIS transistor 12 in the output circuit 3 from being turned ON before the NMIS transistor 6 in the electrostatic discharge protection circuit 2 is turned ON. In this manner, it is possible to prevent damage to the NMIS transistor 12 or decrease in the surge withstand voltage thereof caused by surge current flowing locally into the NMIS transistor 12.

(Second Embodiment)

Figure 2:
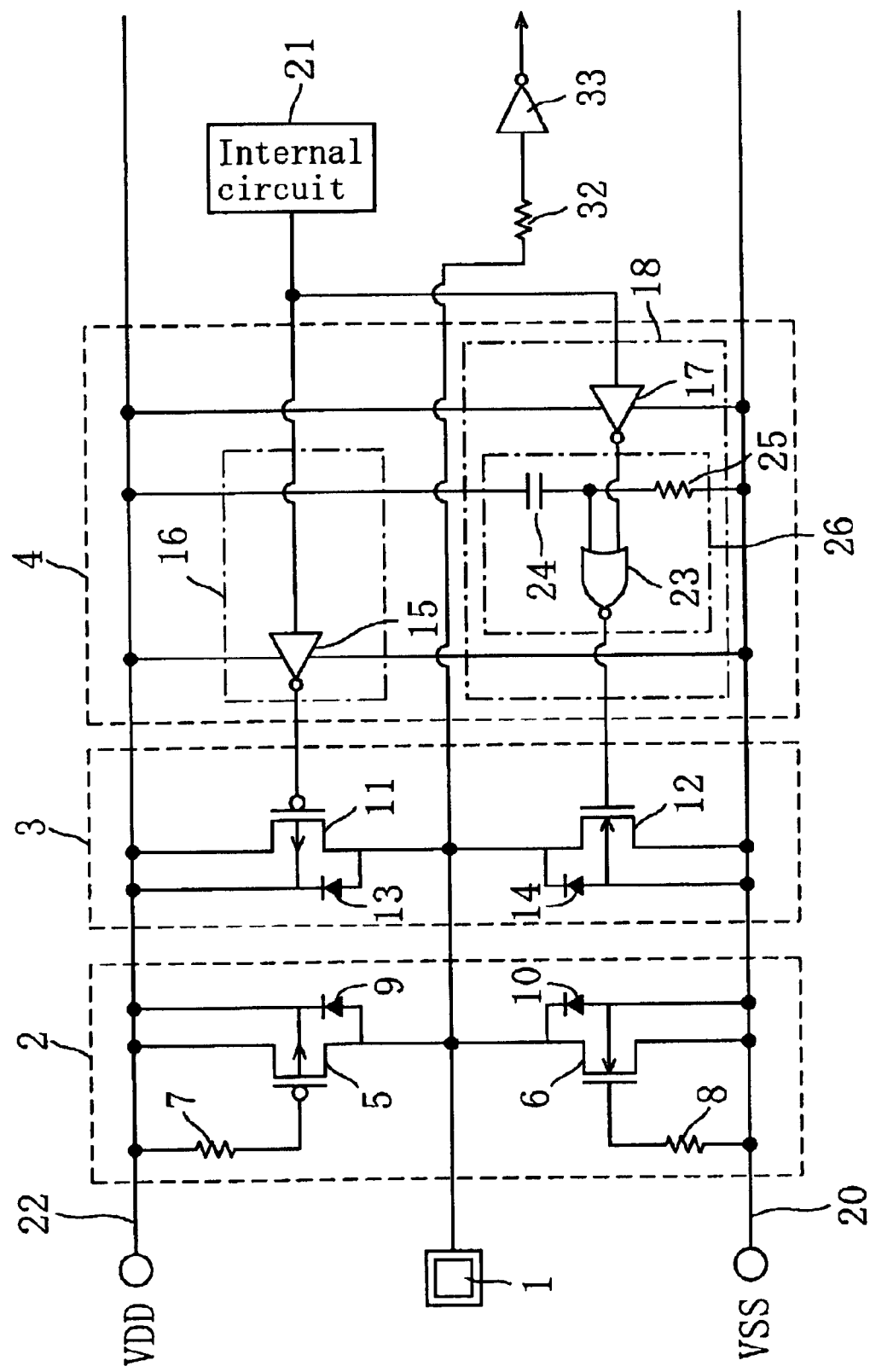
FIG. 2 is an electric circuit diagram illustrating the configuration of an output circuit and other elements around the output circuit in a semiconductor integrated circuit device according to a second embodiment of the present invention.
Figure 3:
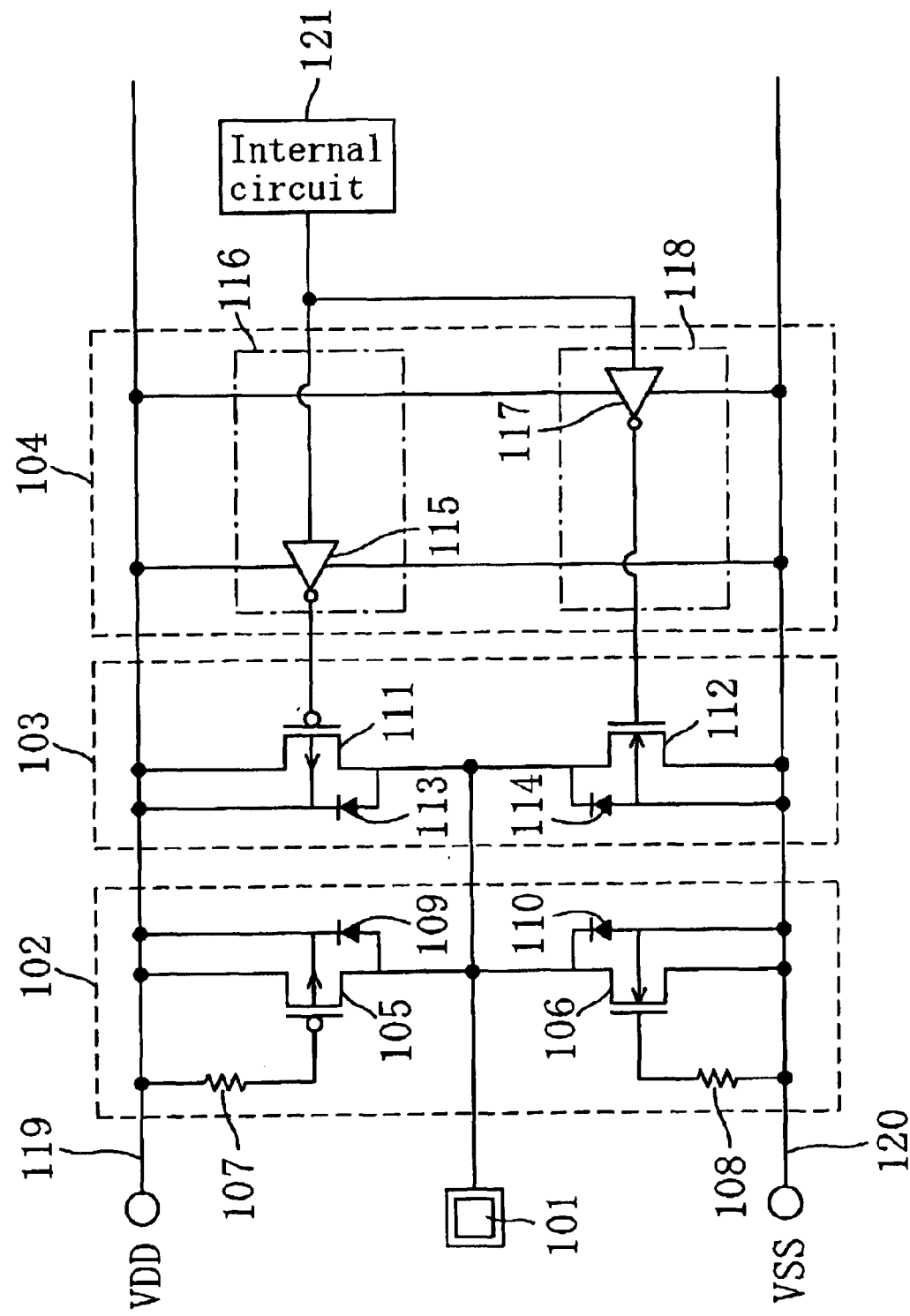
FIG. 3 is an electric circuit diagram illustrating the configuration of an output circuit and other elements around the output circuit in a known semiconductor integrated circuit device including an electrostatic discharge protection circuit.

FIG. 2 is an electric circuit diagram illustrating the configuration of an output circuit and other elements around the output circuit in a semiconductor integrated circuit device including an electrostatic discharge protection circuit according to a second embodiment of the present invention. As illustrated in FIG. 2, the semiconductor integrated circuit device includes an external connection pad 1, an electrostatic discharge protection circuit 2, an output circuit 3, an output pre-buffer circuit 4, an internal circuit 21 and an output-signal-fixing circuit 26, and is configured so that the output circuit 3 is protected by the electrostatic discharge protection circuit 2 from a surge entering through the external connection pad 1. A feature of the present embodiment is the provision of the output-signal-fixing circuit 26, which controls an output signal from the output pre-buffer circuit 4 during an ESD test.

The electrostatic discharge protection circuit 2 is provided between the external connection pad 1 and the output circuit 3, and includes a PMIS transistor 5, an NMIS transistor 6, a first resistor 7 and a second resistor 8. The PMIS transistor 5 includes: a source connected to a power supply line 22 for supplying a power supply voltage VDD; a gate connected to the power supply line 22 via the first resistor 7; a drain connected to the external connection pad 1; and a substrate region (n well) connected to the power supply line 22. The NMIS transistor 6 includes: a source connected to a ground line 20 for supplying a ground voltage VSS; a gate connected to the ground line 20 via the second resistor 8; a drain connected to the external connection pad 1; and a substrate region (p well) connected to the ground line 20.

The output circuit 3 is provided between the electrostatic discharge protection circuit 2 and the output pre-buffer circuit 4, and includes a PMIS transistor 11 and an NMIS transistor 12. The PMIS transistor 11 includes: a source connected to the power supply line 22; a gate connected to an output part of a first pre-buffer 15 in the output pre-buffer circuit 4; a drain connected to the external connection pad 1; and a substrate region (n well) connected to the power supply line 22. The NMIS transistor 12 includes: a source connected to the ground line 20; a gate connected to an output part of a NOR pre-buffer 23 in the output pre-buffer circuit 4; a drain connected to the external connection pad 1; and a substrate region (p well) connected to the ground line 20.

The output pre-buffer circuit 4 for amplifying an output signal from the internal circuit 21 is provided between the internal circuit 21 and the output circuit 3, and includes a first pre-buffer circuit 16 and a second pre-buffer circuit 18. The first pre-buffer circuit 16 includes the first pre-buffer 15 in the final stage and the second pre-buffer circuit 18 includes a second pre-buffer 17 in the final stage. The first pre-buffer circuit 16 and the second pre-buffer circuit 18 each include a plurality of pre-buffers according to the degree of amplification by which an output signal from the internal circuit 21 is to be amplified.

In the first pre-buffer circuit 16, each of the pre-buffers includes a voltage supply part connected to the power supply line 22 and a ground part connected to the ground line 20, the output part of the final-stage pre-buffer 15 is connected to the gate of the PMIS transistor 11 in the output circuit 3, and an input part of the pre-buffer in the initial stage is connected to the internal circuit 21. In the second pre-buffer circuit 18, each of the pre-buffers includes a voltage supply part connected to the power supply line 22 and a ground part connected to the ground line 20, and an input part of the pre-buffer in the initial stage is connected to the internal circuit 21. An output part of the final-stage second pre-buffer 17 is connected to a first input part of the NOR pre-buffer 23 in the output-signal-fixing circuit 26, and the output part of the NOR pre-buffer 23 is connected to the gate of the NMIS transistor 12 in the output circuit 3.

The first and second pre-buffer circuits 16 and 18 are configured so that two high and low output signals or two identical output signals are output from the output part of the first pre-buffer 15 in the first pre-buffer circuit 16 and from the output part of the second pre-buffer 17 in the second pre-buffer circuit 18.

The output-signal-fixing circuit 26 is used to fix an output signal from the second pre-buffer circuit 18 at an "L" level (low voltage) during an ESD test, and includes the NOR pre-buffer 23, a capacitor 24 and a third resistor 25. The NOR pre-buffer 23 includes: a voltage supply part (not shown) connected to the power supply line 22; a ground part (not shown) connected to the ground line 20; the first input part connected to the internal circuit 21; and a second input part connected to one electrode of the capacitor 24 and one end of the third resistor 25. Said one electrode of the capacitor 24 is connected to the second input part of the NOR pre-buffer 23 and the other electrode of the capacitor 24 is connected to the power supply line 22. Said one end of the third resistor 25 is connected to the second input part of the NOR pre-buffer 23 and the other end of the third resistor 25 is connected to the ground line 20.

In this embodiment, the NOR pre-buffer 23 in the output-signal-fixing circuit 26 is provided in a stage following the final-stage second pre-buffer 17 in the second pre-buffer circuit 18. Thus, the NOR pre-buffer 23 is configured so that the output part thereof is connected to the gate of the NMIS transistor and the first input part thereof is connected to the output part of the second pre-buffer 17. However, the NOR pre-buffer 23 may be provided between the multiple pre-buffers in the second pre-buffer circuit 18 in such a manner that an output signal from the second pre-buffer circuit 18 is fixed at an "L" level (low voltage). In that case, the NOR pre-buffer 23 functions as a buffer in the second pre-buffer circuit 18. Thus, as long as the input or output circuit functions satisfactorily, the location of the NOR pre-buffer 23 in the second pre-buffer circuit 18 is not limited to the final stage. Also, a NAND pre-buffer may be used instead of the NOR pre-buffer 23 to fix an output signal from the second pre-buffer circuit 18 at an "L" level (low voltage).

With the semiconductor integrated circuit device of the second embodiment, even when an output from the internal circuit 21 is in a floating state, the output-signal-fixing circuit 26 fixes an output signal from the second pre-buffer circuit 18 at an "L" level (low voltage). Therefore, the gate voltage of the NMIS transistor 12 serving as an L-side output circuit in the output circuit 3 is fixed at an "L" level (low voltage), and the NMIS transistor 12 is thus in an OFF state. Accordingly, in the case of an ESD test conducted by using an evaluation circuit as illustrated in FIG. 4A based on the HBM discharge waveform specifications as illustrated in FIG. 4B, even when the potential of the power supply line 22, to which the voltage supply part of the second pre-buffer 17 is connected, is increased, the NMIS transistor 12 in the output circuit 3 is in an OFF state. Thus, it is possible to prevent damage to the NMIS transistor 12 or decrease in the surge withstand voltage thereof caused by surge current flowing locally into the NMIS transistor 12.

This effect will now be described in greater detail. When a positive charge is applied to the external connection pad 1 in the semiconductor integrated circuit device illustrated in FIG. 2 during an ESD test, the p-n junction between the drain region and the substrate region (n well) of the PMIS transistor 5 becomes a parasitic forward diode 9 and the p-n junction between the drain region and the substrate region (n well) of the PMIS transistor 11 becomes a parasitic forward diode 13, in the circuit extending from the external connection pad 1 to the power supply line 22. On the other hand, in the circuit extending from the external connection pad 1 to the ground line 20, the p-n junction between the drain region and the substrate region (p well) of the NMIS transistor 6 becomes a parasitic reverse diode 10, and the p-n junction between the drain region and the substrate region (p well) of the NMIS transistor 12 becomes a parasitic reverse diode 14.

Therefore, the positive charge that has been applied to the external connection pad 1 flows into the power supply line 22 through the parasitic forward diodes 9 and 13 to increase the potential of the power supply line 22.

This brings the output pre-buffer circuit 4 into a state as though the power were on. At this point in time, an output from the internal circuit 21 is in a floating state. However, an output signal from the second pre-buffer circuit 18 is fixed at an "L" level (low voltage) by the output-signal-fixing circuit 26, and the NMIS transistor 12 in the output circuit 3 is thus in an OFF state. Therefore, it is possible to prevent the NMIS transistor 12 in the output circuit 3 from being turned ON before the NMIS transistor 6 in the electrostatic discharge protection circuit 2 is turned ON. In this manner, it is possible to prevent damage to the NMIS transistor 12 or decrease in the surge withstand voltage thereof caused by surge current flowing locally into the NMIS transistor 12.

What is claimed is:

1. A semiconductor integrated circuit device, comprising:
    an external connection pad;
    an electrostatic discharge protection circuit connected to the external connection pad;
    an output circuit connected to the external connection pad;
    an output pre-buffer circuit connected to the output circuit;
    an output-signal-fixing circuit connected to the output pre-buffer circuit, the output-signal-fixing circuit being for fixing an output signal from the output pre-buffer circuit at an "L" level; and
    a power supply line and a ground line, the power supply line being for supplying a power supply voltage to the electrostatic discharge protection circuit, the output circuit and the output pre-buffer circuit.

2. The semiconductor integrated circuit device of claim 1, wherein:
    the output-signal-fixing circuit includes first and second capacitors each including two electrodes;
    one of the electrodes of the first capacitor is connected to an output part of a pre-buffer in the pre-buffer circuit and the other electrode of the first capacitor is connected to the ground line; and
    one of the electrodes of the second capacitor is connected to an input part of the pre-buffer and the other electrode of the second capacitor is connected to the power supply line.

3. The semiconductor integrated circuit device of claim 1, wherein:
    the electrostatic discharge protection circuit includes a first PMIS transistor and a first NMIS transistor; the first PMIS transistor including a source connected to the power supply line, a drain connected to the external connection pad, and an n-type substrate region connected to the power supply line; and the first NMIS transistor including a source connected to the ground line, a drain connected to the external connection pad, and a p-type substrate region connected to the ground line;
    the output pre-buffer circuit includes a first pre-buffer circuit and a second pre-buffer circuit; the first pre-buffer circuit including, in a final stage, a first pre-buffer whose voltage supply part is connected to the power supply line; and the second pre-buffer circuit including a second pre-buffer whose voltage supply part is connected to the power supply line;
    the output circuit includes a second PMIS transistor and a second NMIS transistor; the second PMIS transistor including a source connected to the power supply line, a drain connected to the external connection pad, a gate connected to an output part of the first pre-buffer, and an n-type substrate region connected to the power supply line; and the second NMIS transistor including a source connected to the ground line, a drain connected to the external connection pad, a gate connected to an output part of the second pre-buffer, and a p-type substrate region connected to the ground line; and
    the output-signal-fixing circuit includes first and second capacitors; one electrode of the first capacitor being connected to the output part of the second pre-buffer in the output pre-buffer circuit, the other electrode of the first capacitor being connected to the ground line; one electrode of the second capacitor being connected to an input part of the second pre-buffer in the output pre-buffer circuit, and the other electrode of the second capacitor being connected to the power supply line.

4. The semiconductor integrated circuit device of claim 1, wherein:
    the output-signal-fixing circuit includes a NOR pre-buffer, a third capacitor and a resistor, the third capacitor including two electrodes;
    the NOR pre-buffer includes an output part connected to the output circuit, a first input part connected to an output part of a pre-buffer in the pre-buffer circuit, and a second input part connected to one of the electrodes of the third capacitor and one end of the resistor;
    said one electrode of the third capacitor is connected to the second input part of the NOR pre-buffer while the other electrode of the third capacitor is connected to the power supply line; and
    said one end of the resistor is connected to the second input part of the NOR pre-buffer while the other end of the resistor is connected to the ground line.

5. The semiconductor integrated circuit device of claim 1, wherein:

the electrostatic discharge protection circuit includes a first PMIS transistor and a first NMIS transistor; the first PMIS transistor including a source connected to the power supply line, a drain connected to the external connection pad, and an n-type substrate region connected to the power supply line; and the first NMIS transistor including a source connected to the ground line, a drain connected to the external connection pad, and a p-type substrate region connected to the ground line;

the output pre-buffer circuit includes a first pre-buffer circuit and a second pre-buffer circuit; the first pre-buffer circuit including, in a final stage, a first pre-buffer whose power supply part is connected to the power supply line; and the second pre-buffer circuit including, in a final stage, a second pre-buffer whose power supply part is connected to the power supply line;

the output circuit includes a second PMIS transistor and a second NMIS transistor; the second PMIS transistor including a source connected to the power supply line, a drain connected to the external connection pad, a gate connected to an output part of the first pre-buffer, and an n-type substrate region connected to the power supply line; and the second NMIS transistor including a source connected to the ground line, a drain connected to the external connection pad, a gate connected to an output part of the second pre-buffer, and a p-type substrate region connected to the ground line;

the output-signal-fixing circuit includes a NOR pre-buffer, a third capacitor and a resistor, the third capacitor including two electrodes;

the NOR pre-buffer is provided between the second NMIS transistor and the second pre-buffer, and includes an output part connected to the gate of the second NMIS transistor, a first input part connected to the output part of the second pre-buffer, and a second input part connected to one of the electrodes of the third capacitor and one end of the resistor;

said one electrode of the third capacitor is connected to the second input part of the NOR pre-buffer while the other electrode of the third capacitor is connected to the power supply line; and said one end of the resistor is connected to the second input part of the NOR pre-buffer while the other end of the resistor is connected to the ground line.

* * * * *